United States Patent [19]
Mitlehner et al.

[11] Patent Number: 6,157,049
[45] Date of Patent: Dec. 5, 2000

[54] ELECTRONIC DEVICE, IN PARTICULAR FOR SWITCHING ELECTRIC CURRENTS, FOR HIGH REVERSE VOLTAGES AND WITH LOW ON-STATE LOSSES

[75] Inventors: Heinz Mitlehner, Uttenreuth; Michael Stoisiek, Ottobrunn, both of Germany

[73] Assignee: Siemens Aktiengesellschaft, Munich, Germany

[21] Appl. No.: 09/152,408

[22] Filed: Sep. 14, 1998

Related U.S. Application Data

[63] Continuation of application No. PCT/DE97/00352, Feb. 27, 1997.

[30]     Foreign Application Priority Data

Mar. 14, 1996 [DE] Germany .......................... 196 10 135

[51] Int. Cl.$^7$ .............................. H01L 29/78; H01L 33/00
[52] U.S. Cl. .............................. 257/77; 257/124; 257/133
[58] Field of Search ..................... 257/77, 124, 133–135, 257/146, 272, 278, 287, 368, 491, 500

[56]              References Cited

U.S. PATENT DOCUMENTS

| | | | |
|---|---|---|---|
| 4,404,575 | 9/1983 | Nishizawa | 257/264 |
| 5,396,085 | 3/1995 | Baliga | 257/77 |
| 5,406,096 | 4/1995 | Mahli | 257/114 |
| 5,734,180 | 3/1998 | Mahli | 257/77 |
| 6,002,143 | 12/1999 | Terasawa | 257/77 |

FOREIGN PATENT DOCUMENTS

| | | |
|---|---|---|
| 2855546 | 7/1979 | Germany . |
| 61-161015 | 7/1986 | Japan . |

OTHER PUBLICATIONS

"Critical nature of Oxide/Interface quality for SiC Power Devices", B. Baliga, 8226 Microelectronic Engineering, Jun. 28, 1995, Nos. 1/4, Amsterdam, Netherlands, pp. 177–184.

"Junction Breakdown", A.S. Grove, Physics and Technology of Semiconductor Devices, pp. 191–194.

"High–Speed Semiconductor Devices", S.M. Sze, A Wiley–Interscience Publication, John Wiley & Sohns, Inc., pp. 234–235 and 266–267.

Published International Application No. 95/24055 (Mitlehner et al.), dated Sep. 8, 1995.

*Primary Examiner*—John Guay
*Attorney, Agent, or Firm*—Herbert L. Lerner; Laurence A. Greenberg; Werner H. Stemer

[57]              ABSTRACT

A p-n junction is connected between two terminals. The p-n junction is formed between two semiconductor regions of a semiconductor with a breakdown field strength of at least $10^6$ V/cm. A channel region, which adjoins the p-n junction is connected in series with a silicon component between the two terminals. The channel region is provided in a first of the two semiconductor regions. A depletion zone of the p-n junction carries the reverse voltage in the off state of the silicon component. The silicon component is preferably a

8 Claims, 5 Drawing Sheets

ELECTRONIC DEVICE, IN PARTICULAR FOR SWITCHING ELECTRIC CURRENTS, FOR HIGH REVERSE VOLTAGES AND WITH LOW ON-STATE LOSSES

CROSS-REFERENCE TO RELATED APPLICATION

This is a continuation of copending international application PCT/DE97/00352, filed Feb. 27, 1997, which designated the United States.

BACKGROUND OF THE INVENTION

Field of the Invention:

The invention relates to electronic devices, and particularly to electronic switching devices.

Semiconductor components are used in addition to mechanical switchgear for switching electric currents. Semiconductor components can be divided into current-controlled semiconductor components, including bipolar transistors and thyristors, on the one hand, and voltage-controlled semiconductor components such as, for example, the unipolar MOS (Metal Oxide Semiconductor) field-effect transistors (MOSFET), or the bipolar MOS-controlled thyristors (MCT), or the MOS-controlled bipolar transistors (IGBT), on the other hand. All of these semiconductor components can only switch currents in one current direction, that is to say only for a specific polarity of the operating voltage (switchable state). In the switchable state, by alteration of the control voltage or of the control current, the semiconductor component can be switched from an off state, in which virtually no current flows through the semiconductor component, into an on state, in which a current flows through the semiconductor component, or vice versa. In the on state, the current flowing through the semiconductor component is dependent on the magnitude of the operating voltage and the driving control voltage or the driving control current. In its off state, each semiconductor component can be reverse-biased only up to a maximum reverse voltage (breakdown voltage). A charge carrier breakdown occurs at higher reverse voltages and may rapidly lead to the destruction of the component. For alternating currents, two semiconductor components are, as a rule, reverse-connected in parallel (bidirectional connection).

Silicon (Si) is used, in practice, as the semiconductor material for semiconductor components, in particular for power electronics. One of the reasons is that silicon process technology is highly developed. Also, voltage-controlled MOS semiconductor components using silicon have high switching speeds owing to the high charge carrier mobility of silicon in the channel region of the MOS structure. One problem of MOSFETs is that the steady-state losses in the on state become higher, the higher the reverse voltages to be managed by the MOSFET in the off state are. In silicon, the steady-state power loss of a power MOSFET which is designed for high reverse voltages starting from about 600 V becomes so high at forward currents starting typically from about 5 A that bipolar IGBTs in silicon are preferred to the silicon MOSFETs for these and higher switching currents and reverse voltages.

The international publication WO 95/24055 discloses a MOSFET which is formed in the semiconductor material of silicon carbide (SiC). Given the same blocking capability of more than 600 V, such a silicon carbide MOSFET can be designed with lower on-state losses than a silicon MOSFET. However, the process technology in silicon carbide, in particular for the MOS structure, is not yet as advanced as in silicon. The result is that silicon carbide MOSFETs are not yet mass produced.

SUMMARY OF THE INVENTION

It is accordingly an object of the invention to provide an electronic device for high blocking voltages and low on-state power losses, which overcomes the above-mentioned disadvantages of the heretofore-known devices and methods of this general type and which can be laid out for high reverse voltages of more than 500 V yet has only low losses in the on-state mode.

With the foregoing and other objects in view there is provided, in accordance with the invention, an electronic device, particularly for switching electrical currents, comprising:

two electrical terminals for connecting electrical operating voltages with maximum values of above 500 V;

a silicon component connected between the two electrical terminals and being selectively in an on state or an off state depending on a predetermined polarity of the operating voltages;

a semiconductor configuration made of silicon carbide with a first semiconductor region of a predetermined conductivity type and with at least one further semiconductor region of an opposite conductivity type;

the semiconductor configuration and the silicon component together forming an integrated hybrid component;

a p-n junction formed between the first semiconductor region and the at least one further semiconductor region;

the first semiconductor region having at least one channel region adjacent the p-n junction and electrically connected in series with the silicon component between the two terminals;

the p-n junction being electrically connected between the two terminals in a reverse direction for the operating voltage of the predetermined polarity; and a depletion zone of the p-n junction pinching off or covering the at least one channel region of the first semiconductor region in the off state of the silicon component.

The invention is based on the premise of combining the good controllability and the diverse embodiments of silicon components, in particular for power switching technology, with the high blocking capability of a p-n junction in a semiconductor with a breakdown field strength of at least $10^6$ V/cm (volts per centimeter) in a particular and advantageous manner. The breakdown field strength is the maximum field strength permitted to occur in a semiconductor without destroying the semiconductor by a charge carrier breakdown.

In summary, the electronic device has two electrical terminals for the application of electrical operating voltages, a silicon-based semiconductor component and, in addition, a semiconductor configuration. The semiconductor configuration comprises a first semiconductor region of a first conductivity type and at least one further semiconductor region of an opposite, second conductivity type. The semiconductor regions are each formed by a semiconductor with a breakdown field strength at least $10^6$ V/cm. A p-n junction is formed in each case between the oppositely conducting semiconductor regions. At least one channel region, adjoining the p-n junction, in the first semiconductor region of the semiconductor configuration is then electrically connected in series with the silicon component between the two terminals. At operating voltages of a predetermined polarity, the silicon component has an on state and an off state. An electric current flows through the silicon component in the on state, while a virtually negligible reverse current flows in the off state. The p-n junction of the semiconductor configuration is electrically connected between the two terminals in the reverse direction for the operating voltages with the predetermined polarity. When the silicon component is in its off state, the depletion zone of the at least one p-n junction pinches off the channel region in the first semiconductor region or even covers the entire channel region. Owing to the substantially higher electrical resistance of the depletion zone in comparison with the channel region, a large proportion of the operating voltage between the two terminals is already dropped across the depletion zone of the p-n junction in the off state of the silicon component. On account of the high breakdown field strength of at least $10^6$ V/cm of the semiconductor which is provided for the semiconductor regions of the p-n junction, the p-n junction of the semiconductor configuration can carry distinctly higher reverse voltages than a p-n junction having the same charge carrier concentrations and dimensions which is formed in silicon. For comparison, the breakdown field strength of silicon is about $2 \cdot 10^5$ V/cm. Therefore, the silicon component only has to be designed for the remaining part of the reverse voltage between the two terminals. This in turn has the consequence of a distinctly reduced power loss of the silicon component in the on-state mode. Furthermore, in the other circuit path, the entire operating voltage between the two terminals is applied as reverse voltage to the p-n junction of the semiconductor configuration.

In the on state of the silicon component, the depletion zone of the p-n junction is flooded with charge carriers and the channel region in the first semiconductor region of the semiconductor configuration is opened again. An electric current can then flow through the channel region between the two terminals. The total power loss of the electronic device in the on-state mode (current-carrying mode) comprises the losses in the silicon component in the on state and the losses in the first semiconductor region of the semiconductor configuration. At a predetermined maximum reverse voltage, these total losses of the electronic device are distinctly lower than in the case of a silicon component which is of the same structural type and is designed for this maximum reverse voltage, when considered solely by itself. They are also lower than in the case of a semiconductor component which is designed for the predetermined maximum reverse voltage, is of the same structural type as the silicon component and is formed in the same semiconductor as the semiconductor configuration.

In accordance with an added feature of the invention, the first semiconductor region has a first surface and the at least one further semiconductor region is arranged on the first surface, preferably by means of ion implantation. This embodiment is advantageous in respect of production, In accordance with an additional feature of the invention, the first semiconductor region has a second surface opposite the first surface of the first semiconductor region, and an electrode disposed on the second surface. The electrode can be electrically connected to one pole of the operating voltage.

In an alternative embodiment, a further semiconductor region of an opposite conductivity type is disposed on the second surface, and an electrode is disposed on a surface of the further semiconductor region that is remote from the first semiconductor region. Again, the electrode can be electrically connected to a pole of the operating voltage. In this embodiment, an additional p-n junction is connected between the two terminals of the electronic device.

In accordance with a particularly advantageous feature of the invention, the semiconductor configuration further comprises at least two further semiconductor regions of an opposite conductivity type to the first semiconductor region, and where each of the two further semiconductor regions forms a respective one of two p-n junctions with the first semiconductor region, and the at least one channel region is bounded by the two p-n junctions. In the off state of the silicon component, the depletion zones of the p-n junctions merge and thus terminate the channel region as common depletion zone.

A preferred semiconductor material for the semiconductor configuration is silicon carbide (SiC). Silicon carbide is particularly suited owing to its outstanding electronic and thermal properties.

Since a semiconductor with a high breakdown field strength generally also has a high energy gap between valence band and conduction band, the semiconductor configuration can be designed for higher current densities than the silicon component and, consequently, the total area and the material requirement of the semiconductor configuration can be reduced. The greater heating of the semiconductor configuration associated with the higher current densities does not have a disadvantageous effect owing to the temperature strength of the semiconductor of the semiconductor configuration on account of the high energy gap of the semiconductor.

In accordance with a further feature of the invention, the silicon component contains a MOS structure controlling the current flow and thus for switching between the on state and the off state. The high MOS channel mobility of the charge carriers in silicon is utilized in this embodiment. In accordance with a concomitant feature of the invention, the silicon component is a unipolar silicon MOSFET.

Other features which are considered as characteristic for the invention are set forth in the appended claims.

Although the invention is illustrated and described herein as embodied in an electronic device, in particular for switching electronic currents, for high off-state voltages and with low on-state power losses, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
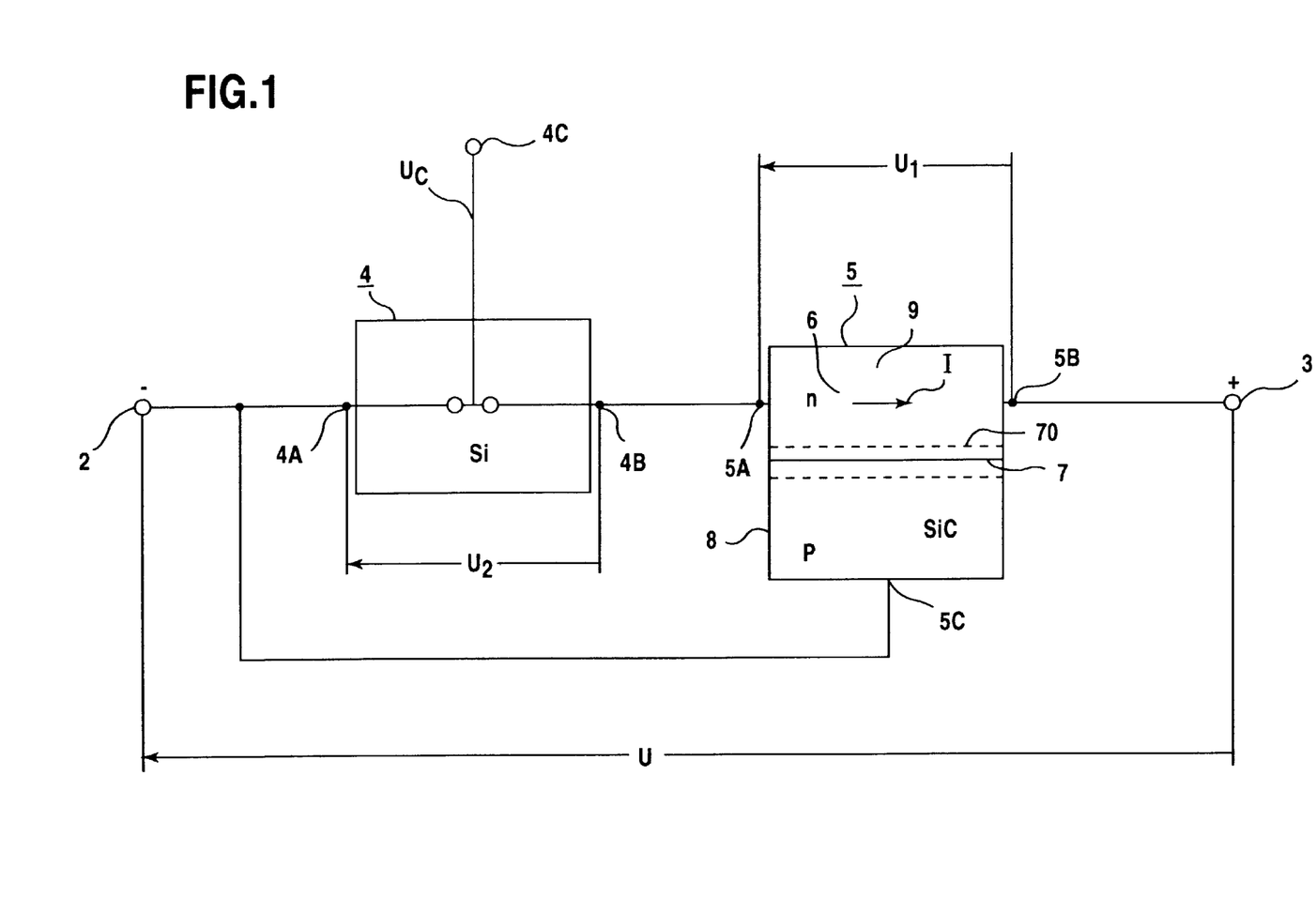
FIG. 1 is a diagrammatic view of a circuit structure of an electronic device according to the invention.

Referring now to the figures of the drawing in detail, wherein like components are identified with like reference numerals, and first, particularly, to the sketched circuit diagram of FIG. 1 thereof, there is seen a fundamental structure of the electronic device 1. The electronic device comprises two electrical terminals 2 and 3, a silicon component (semiconductor component based on the semiconductor silicon) 4 and a semiconductor configuration 5. An operating voltage U is applied between the two terminals 2 and 3 during operation of the electronic device, which voltage may be constant with respect to time or it may be variable.

The silicon component 4 has a first terminal 4A, a second electrical terminal 4B, and a control terminal 4C. Given a specific polarity of a voltage $U_2$ between the terminals 4A and 4B, the silicon component is in a switchable state (switching state, switching direction) and, in dependence on a control voltage $U_c$ at the control terminal 4C, or a control current, can switch through or switch off an electric current between the two terminals 4A and 4B. With the aid of the control voltage $U_c$ or the control current, therefore, the silicon component 4 can, at the predetermined polarity of the voltage $U_2$, be brought from an on state (current-carrying state) to an off state (zero-current state), or vice versa. At the opposite polarity of the voltage U2 between the two terminals 4A and 4B, the silicon component 4 is in a non-switchable state and can then no longer be controlled by the control voltage $U_c$ or the control current.

The semiconductor configuration 5 comprises a first semiconductor region 6 of one conductivity type and at least one further semiconductor region 8 adjacent the first semiconductor region 6. The region 8 has an opposite conductivity as compared to the first semiconductor region 6. The semiconductor regions 6 and 8 of the semiconductor configuration 5 are each composed of a semiconductor material with a breakdown field strength of at least $10^6$ V/cm. Suitable semiconductor materials are diamond, aluminum nitride (AlN), gallium nitride (GaN), indium nitride (InN) and, preferably, silicon carbide (SiC), preferably of the polytypes 4H and/or 6H. A p-n junction 7 is formed, with a depletion zone (space charge zone, depletion layer) 70, between the two semiconductor regions 6 and 8. The depletion zone 70 is produced by charge carrier diffusion between the two semiconductor regions 6 and 8 and is distinguished by a very high electrical resistance in comparison with the semiconductor regions 6 and 8. The extent of the depletion zone 70 depends on a voltage (potential difference) between the two semiconductor regions 6 and 8. That voltage is present at the p-n junction 7.

The first semiconductor region 6 is assigned two electrical contacts 5A and 5B of the semiconductor configuration 5. The contacts are connected to one another via a channel region 9 in the first semiconductor region 6. The channel region 9 is bounded in its extent by the depletion zone 70 of the p-n junction 7. The second semiconductor region 8 is assigned a further contact 5C of the semiconductor configuration 5. The contat 5C connects the second semiconductor region 8 to the first terminal 2 of the electronic device. The first contact 5A at the channel region 9 is electrically connected to the second terminal 4B of the silicon component 4. The first terminal 4A of the silicon component 4 is electrically connected to the first terminal 2 of the electronic device. Consequently, the silicon component 4 and the channel region 9 are electrically connected in series between the two terminals 2 and 3 of the electronic device. The second contact 5B of the semiconductor configuration 5 at the channel region 9 is electrically connected to the second terminal 3 of the electronic device. As a result, the p-n junction 7 is electrically connected between the two terminals 2 and 3.

The conductivity types of the semiconductor regions 6 and 8 forming the p-n junction 7 are chosen in such a way that the p-n junction 7 of the semiconductor configuration 5 blocks when an operating voltage U in the switching direction for the silicon component 4 is present at the terminals 2 and 3. Since the p-n junction 7 is thus reverse-biased in particular even when the silicon component 4 is in the off state, its depletion zone 70 carries virtually the entire reverse voltage U between the terminals 2 and 3 up to a maximum value of the reverse voltage, the so-called breakdown voltage. In the exemplary embodiment of FIG. 1, it is assumed that the silicon component 4 is biased (switched) in the switching direction when the electrical potential at its first terminal 4A is negative relative to the potential at its second terminal 4B. This corresponds to the case where the negative pole of the operating voltage U is present at the first terminal 2 of the electronic device and the positive pole of the operating voltage U at the second terminal 3. Consequently, the first semiconductor region 6, electrically connected to the second terminal 3, of the semiconductor configuration 5 is thus chosen to be n-conducting and the second semiconductor region 8, electrically connected to the first terminal 2, of the semiconductor configuration 5 is thus chosen to be p-conducting. In the case of reversed polarity (directionality) of the silicon component 4, it is indeed necessary to interchange the conductivity types of the two semiconductor regions 6 and 8 forming the p-n junction 7.

If the small voltage drops of the electrical connections are ignored, then the operating voltage U in the circuit path with the silicon component 4 is divided into two voltage components $U_1$ and $U_2$. The first voltage component $U_1$ is dropped between the contacts 5A and 5B of the semiconductor configuration 5. The second voltage component $U_2$ is dropped between the terminals 4A and 4B of the silicon component 4. In the other circuit path, virtually the total operating voltage U is dropped across the depletion zone 70 of the p-n junction 7 of the semiconductor configuration 5.

The silicon component 4 is illustrated in its on state in FIG. 1, indicated by the closed switch contact. Since an electric current I then flows through the silicon component 4, charge carriers are injected into the depletion zone 70 of the p-n junction 7. As a result, the depletion zone 70 retreats and has a comparatively small extent determined by the remaining reverse voltage between the contacts 5B and 5C. The channel region 9 is thus opened, and the electric current I can flow through the series circuit formed by the silicon component 4 and the channel region 9 of the first semiconductor region 6 of the semiconductor configuration 5. In this case, the channel region 9 of the semiconductor configuration 5 is available, in general, virtually completely as a current path for the electric current I.

If the silicon component 4 is then brought into its off state by altering the control voltage $U_c$ at the same polarity of the operating voltage U, then the depletion zone 70 of the p-n junction 7 expands and interrupts the current path (electrically semiconducting region) in the channel region 9. As a result of the depletion of charge carriers, the channel region 9 may either be pinched off by the depletion zone 70, that is to say interrupted at least in a partial region transversely to the current direction, or even be completely covered. For this purpose, the geometrical dimensions of the first semiconductor region 6 and of the second semiconductor region 8 and the charge carrier concentrations to be set by way of the doping in the two semiconductor regions 6 and 8 are preferably chosen in such a way that the electrical potential at the contact 5A of the semiconductor configuration 5 is always less than the breakdown voltage (maximum reverse voltage) $U_{max}$ of the silicon component 4. It is then ensured that a wide partial zone of the depletion zone 70 sufficient for the breakdown voltage $U_{max}$ predetermined by the silicon component 4 is electrically connected between the contacts 5A and 5B and the silicon component 4 is not destroyed. The first semiconductor region 6 is preferably more weakly doped than the second semiconductor region 8, at least in the channel region 9. The depletion zone 70 of the p-n junction 7 then expands to a greater extent into the first semiconductor region 6, with the advantage of better drivability of the control of the bulk resistance of the channel region 9 by the depletion zone 70. A voltage component $U_1$ of the operating voltage U, acting as reverse voltage, is then dropped across the depletion zone 70, having a high electrical resistance, between the contacts 5A and 5B of the semiconductor configuration 5.

The silicon component 4 may be a commercially available silicon-based semiconductor component, preferably a voltage-controlled MOS (metal oxide semiconductor) component (power MOS device). In the case of a MOS voltage-controlled silicon component 4, the control terminal 4C is the gate terminal of the MOS structure. A power MOSFET (metal oxide semiconductor field effect transistor) in silicon, preferably of the normally off type, is particularly suitable as the silicon component 4. Alternatively, a silicon MESFET (metal semiconductor field effect transistor) can be used as the silicon component 4.

Since the semiconductor configuration 5 takes over the voltage component $U_1$ of the operating reverse voltage U in the off state of the silicon component 4, the silicon component 4 needs no longer to be designed for the entire maximum operating reverse voltage $U_{max}$. The semiconductor configuration 5 is preferably designed for the maximum operating voltage $U_{max}$ between the two terminals 2 and 3 of the electronic device. The silicon component 4 is generally designed for a maximum reverse voltage (breakdown voltage) at its two terminals 4A and 4B of less than 350 V, in particular less than 100 V, and preferably less than 50 V. For example, a Siemens type BSM 101 AR MOSFET with a maximum reverse voltage of 50 V, a forward resistance of 3 mΩ and a desired rated current-carrying capacity in the on-state mode may be used. At breakdown voltages of less than about 350 V, the channel resistance of the MOS structure is greater than the drift resistance in the silicon component 4. Preferably, the breakdown voltage of the silicon component 4 is chosen to be low enough that the drift resistance of the silicon component 4 is negligible relative to the channel resistance thereof, for example is at most 0.2 times the channel resistance. The on-state losses of a silicon component 4 with a maximum reverse voltage of 50 V are, for example, significantly lower than in the case of a silicon component 4 which is designed for a reverse voltage of 600 V. Since, owing to the high breakdown strength of the semiconductor of the semiconductor configuration 5, the geometrical dimensions of the first semiconductor region 6 can be set to be distinctly smaller compared with silicon for the same reverse voltage, the drift resistance in the semiconductor configuration 5 can also be kept small. Due to the combination of the low-voltage silicon component 4 with the semiconductor configuration 5 having a high blocking capability, the electronic device consequently has only low on-state losses even at high reverse voltages of more than 500 V.

For given semiconductor materials, the blocking capability of the p-n junction 7 of the semiconductor configuration 5 is adapted by the geometrical dimensions and the dopings of the semiconductor regions 6 and 8 to the predetermined maximum operating reverse voltage $U_{max}$. For predetermined dopings, the dimensions are chosen to be larger for larger maximum reverse voltages $U_{max}$. For predetermined dimensions, the doping of the first semiconductor region 6 at least in the channel region 9 is chosen to be lower, the greater the desired maximum reverse voltage $U_{max}$ is. Typical values for the n-type doping of the first semiconductor region 6, when a silicon carbide of the 4H polytype is used as the semiconductor material, are $n=1\cdot 1016$ cm$^{-3}$ for a maximum reverse voltage $U_{max}=600$ V present at the p-n junction 7, $n=8\cdot 1015$ cm$^{-3}$ for $U_{max}=1200$ V and $n=5\cdot 1015$ cm$^{-3}$ for $U_{max}=1800$ V. On account of the high breakdown strength of the semiconductor material of the semiconductor configuration 5, the blocking capability of the depletion zone 70 of the p-n junction 7 is very much higher than it would be in silicon. Consequently, the absolute extent of the semiconductor regions 6 and 8 can also, preferably, be chosen to be small. In the case of the semiconductor material silicon carbide (SiC), for example, it is possible to choose dimensions which are smaller than in silicon by a factor of 10. The consequence of this is a bulk resistance which is reduced by the same factor of 10 and thus correspondingly lower on-state losses on the semiconductor configuration 5.

Referring now to FIGS. 2 to 5, there are shown various advantageous embodiments of a semiconductor configuration that can be utilized as the semiconductor configuration 5 in the electronic device according to FIG. 1.

Figure 2:
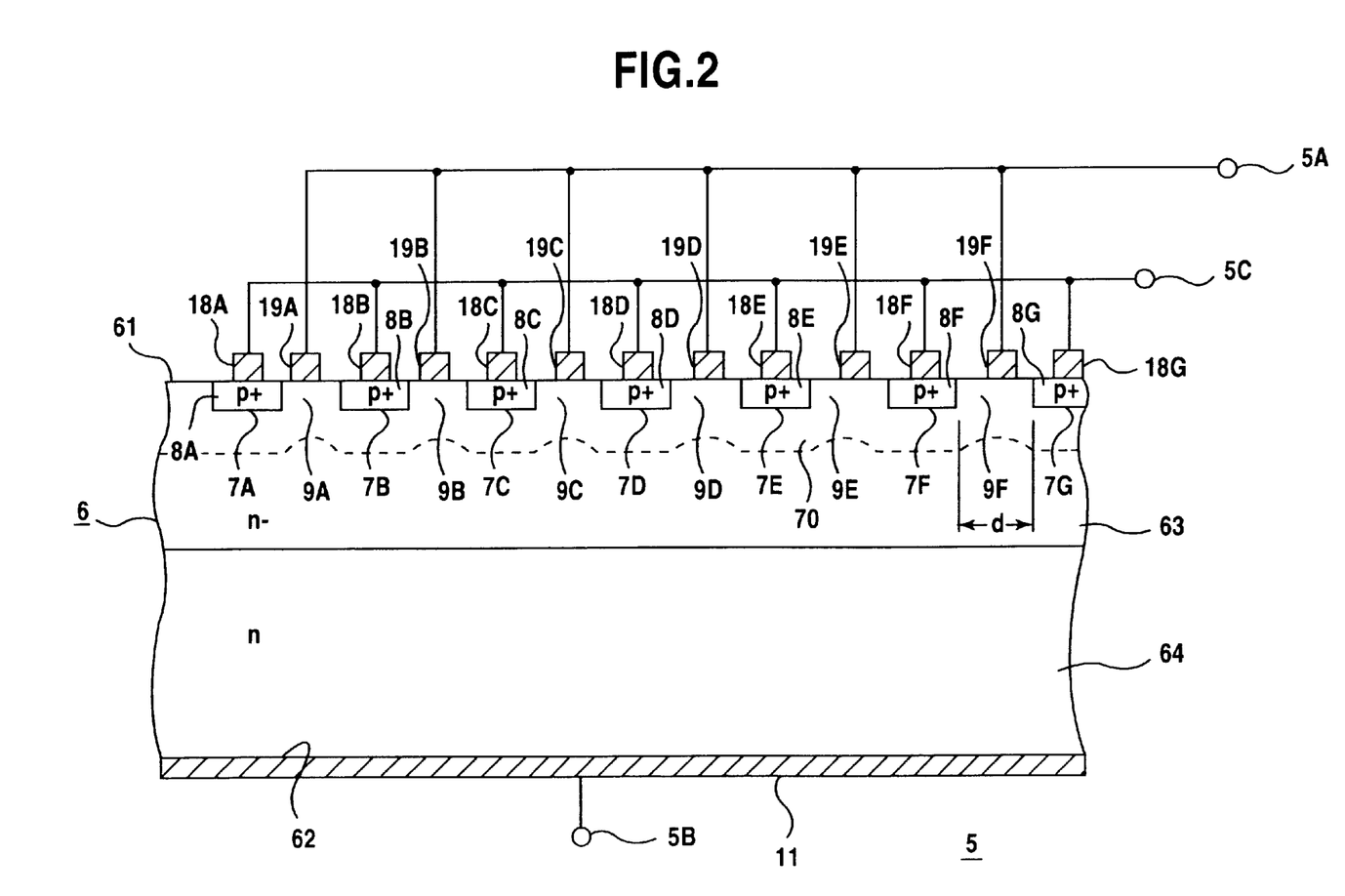
FIG. 2 is a partial sectional view through a first embodiment of a semiconductor configuration for the electronic device.

Referring first to FIG. 2, there is shown in cross-section the first semiconductor region 6 formed by a substrate 64 of a first conductivity type (n-conductivity in the example of the figure) and a semiconductor layer 63 of the same conductivity type as the substrate 64. The semiconductor layer is preferably epitaxially grown on the substrate 64. The semiconductor layer 63 is preferably more weakly doped (n$^-$-doped) than the substrate 64 (n-doped). That surface of the semiconductor layer 63 which is remote from the substrate 64 forms a first surface 61 of the first semiconductor region 6. That surface of the substrate 64 which is remote from the semiconductor layer 63 forms a second surface 62 of the first semiconductor region 6.

A plurality of further, mutually spaced-apart semiconductor regions 8A, 8B, 8C, 8D, 8E, 8F and 8G are disposed on the first surface 61 of the first semiconductor region 6, and are in each case of the opposite conductivity type (of the p conductivity type in the example of the figure) as compared to the first conductivity type. The further semiconductor regions are preferably fabricated by ion implantation into the semiconductor layer 63. The semiconductor regions 8A to 8G (p$^+$-type regions) are preferably doped essentially identically with identical doping depth profiles. The associated p-n junctions which are formed by the semiconductor layer 63 and a respective one of the further, oppositely doped semiconductor regions 8A to 8G are correspondingly designated by 7A to 7G. Preferably, the further semiconductor regions 8A to 8G are each doped more heavily (p$^+$) than the semiconductor layer 63. Each of the further semiconductor regions 8A to 8G carries a respective electrode 18A, 18B, 18C, 18D, 18E, 18F, and 18G on its surface. The electrodes 18A to 18G are electrically connected to one another and to the third terminal 5C of the semiconductor configuration 5. Formed between each pair of semiconductor regions 8A to 8G in the semiconductor layer 63 is a respective channel region, running essentially vertically with respect to the first surface 61 and reaching up to this first surface 61: 9A (between the semiconductor regions 8A and 8B), 9B (between the semiconductor regions 8B and 8C), 9C (between the semiconductor regions 8C and 8D), 9D (between the semiconductor regions 8D and 8E), 9E (between the semiconductor regions 8E and 8F), and 9F (between the semiconductor regions 8F and 8G). An electrode 19A and 19B and 19C and 19D and 19E and 19F is respectively assigned to each of the channel regions 9A to 9F for the purpose of electrically contacting on the first surface 61 of the semiconductor layer 63. All the electrodes 19A to 19F are electrically connected to the first terminal 5A of the semiconductor configuration 5. The electrodes 18A to 18G, on the one hand, and the electrodes 19A to 19F, on the other hand, are electrically insulated from one another by a non-illustrated dielectric and can each be formed by a metal or else, in particular in the case of silicon carbide as semiconductor for the semiconductor configuration 5, by polysilicon.

A large-area electrode 11 is advantageously arranged on the second surface 62 of the first semiconductor region 6 on the rear side of the substrate 64 and is electrically connected to the second terminal 5B of the semiconductor configuration 5.

In the on-state mode, an electric current flows between the two terminals 5A and 5B through the channel regions 9A to 9F, the semiconductor layer 63 and the substrate 64 in a current direction which is essentially vertical with reference to the surfaces 61 and 62. This embodiment of the semiconductor configuration 5 according to FIG. 2 can therefore be compared with a vertical junction field-effect transistor (JFET).

The distances between mutually adjacent semiconductor regions 8A and 8B or 8B and 8C, etc. determine the channel width of the channel regions 9A to 9F. These distances are preferably all smaller than the widths (extents) of the depletion zones of the p-n junctions 7A to 7G given a maximum operating reverse voltage $U_{max}$ between the terminals 5B and 5C. As a result, in the zero-current case (off-state mode), the individual depletion zones of the p-n junctions 7A to 7G overlap to form a common depletion zone 70, which preferably covers all the channel regions 9A to 9F and is extended into the semiconductor layer 63. The smaller the distances are between each two neighboring semiconductor regions 8A to 8G at a predetermined maximum operating reverse voltage $U_{max}$, the more planar the common depletion zone 70 becomes, with the result that the blocking capability is not significantly influenced by the "island structure" of the semiconductor regions 8A to 8G ($p^+$-type regions) and the curved profile thereof. The distances between the semiconductor regions 8A to 8G are preferably essentially equal to a fixed distance d. The distance d or the distances between the semiconductor regions 8A to 8G are generally chosen to be between about 5 μm and about 20 μm. The dimensioning of the distances or of the distance d between the semiconductor regions 8A to 8G is dependent, in particular, on the breakdown voltage of the silicon component 4 that is chosen and is not illustrated in FIG. 2. The absolute value of the difference between the electrical potential at the electrodes 18A to 18G and the electrical potential at the terminal 2 should be less than, and preferably distinctly less than, the breakdown voltage of the silicon component 4, in order to avoid destruction of the silicon component 4.

The semiconductor regions 8A to 8G may be individual regions (islands) which are separated from one another, or else spaced-apart partial regions of a contiguous region. The thickness of the semiconductor layer 63 is, of course, chosen likewise to be sufficiently large for the maximum reverse voltage $U_{max}$.

Figure 3:
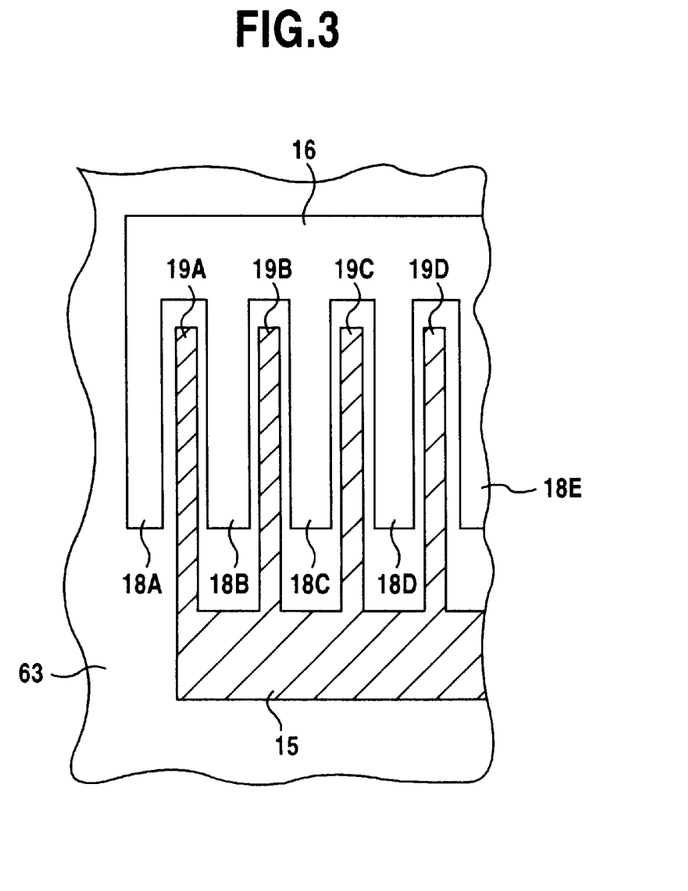
FIG. 3 is a partial plan view thereof.

FIG. 3 shows a plan view of the first surface 61 of the first semiconductor region 6 of a semiconductor configuration 5 according to FIG. 2 with electrodes 18A to 18E, which are connected together like a comb via a conductor strip 16, and electrodes 19A to 19D, which are connected together like a comb via a conductor strip 15. The electrodes 19A to 19D project into the gaps between the electrodes 18A to 18E. The electrode structure that intermeshes similarly to two combs can be produced with a single-layer metallization. The semiconductor regions 8A to 8G situated under the electrodes 18A to 18G are then preferably of insular design.

Figure 4:
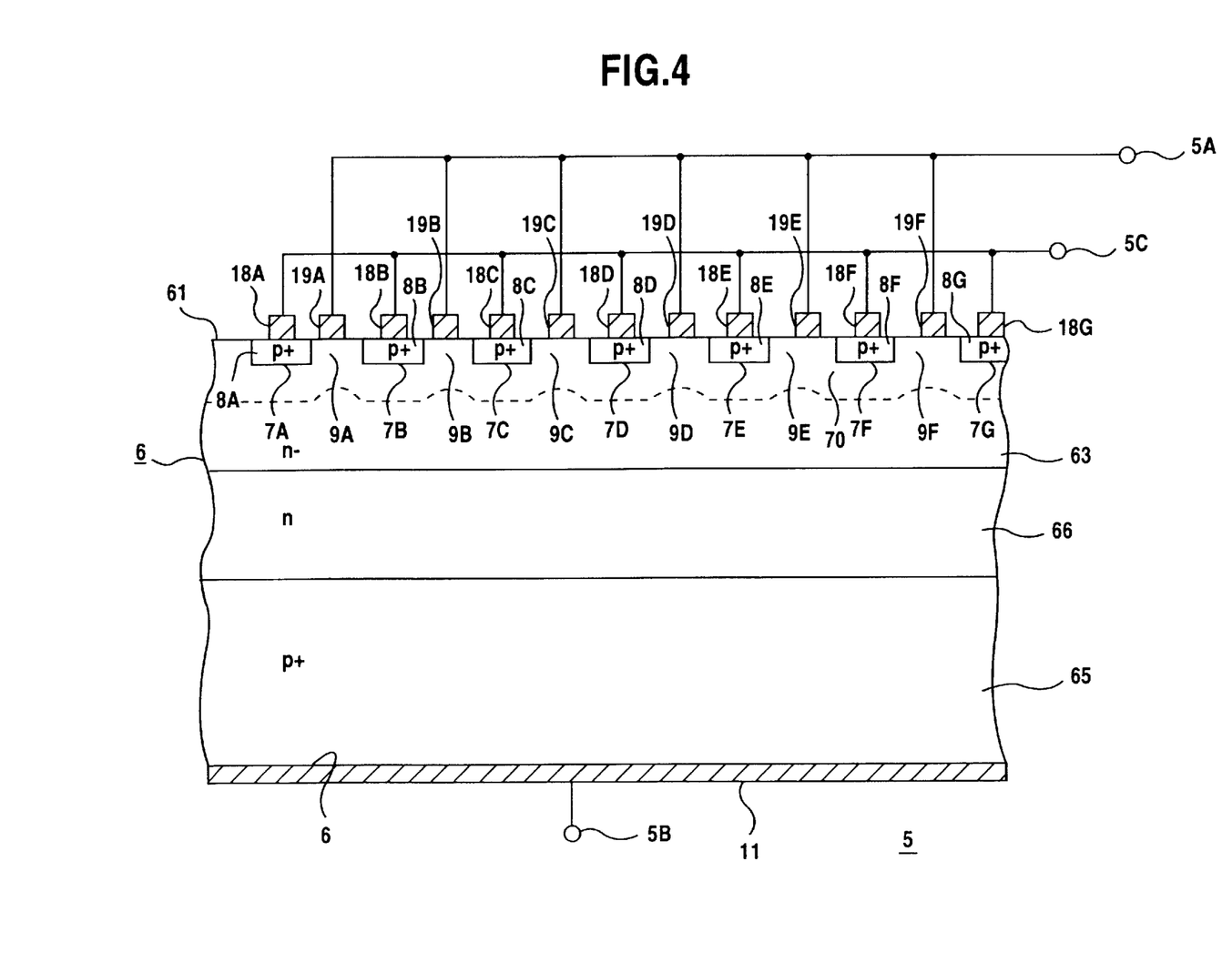
FIG. 4 is a partial sectional view similar to that of FIG. 2.

FIG. 4 illustrates a development of the semiconductor configuration 5 according to FIG. 2. The semiconductor layer 63 ($n^-$) is here arranged via a buffer layer 66 on a oppositely doped ($p^+$) substrate 65. In general, the buffer layer 66 is likewise formed from a semiconductor with a breakdown field strength of at least $10^6$ V/cm. In the illustrated embodiment, the buffer layer 66 is of the same conductivity type (n) as the semiconductor layer 63 and is preferably doped more highly ($n^+$) than the semiconductor layer 63. This is particularly in a realization of a punch-through type, in which the space charge zone 70 punches through to the buffer layer 66. The buffer layer 66 and the semiconductor layer 63 together form the first semiconductor region 6 of the semiconductor configuration 5. In an embodiment that is not illustrated, the buffer layer 66 is, in contrast, of the same conductivity type (p) as the substrate 65.

Thus, in the embodiment according to FIG. 4, an additional p-n junction is introduced into the semiconductor configuration 5 and is connected between the terminals 5A and 5C. In the electronic device according to FIG. 1, this additional p-n junction is electrically connected in series with the silicon component 4 and the channel regions 9A to 9F (9 in FIG. 1) between the two terminals 2 and 3. This embodiment of FIG. 4 is comparable with an IGBT (insulated gate bipolar transistor).

Figure 5:
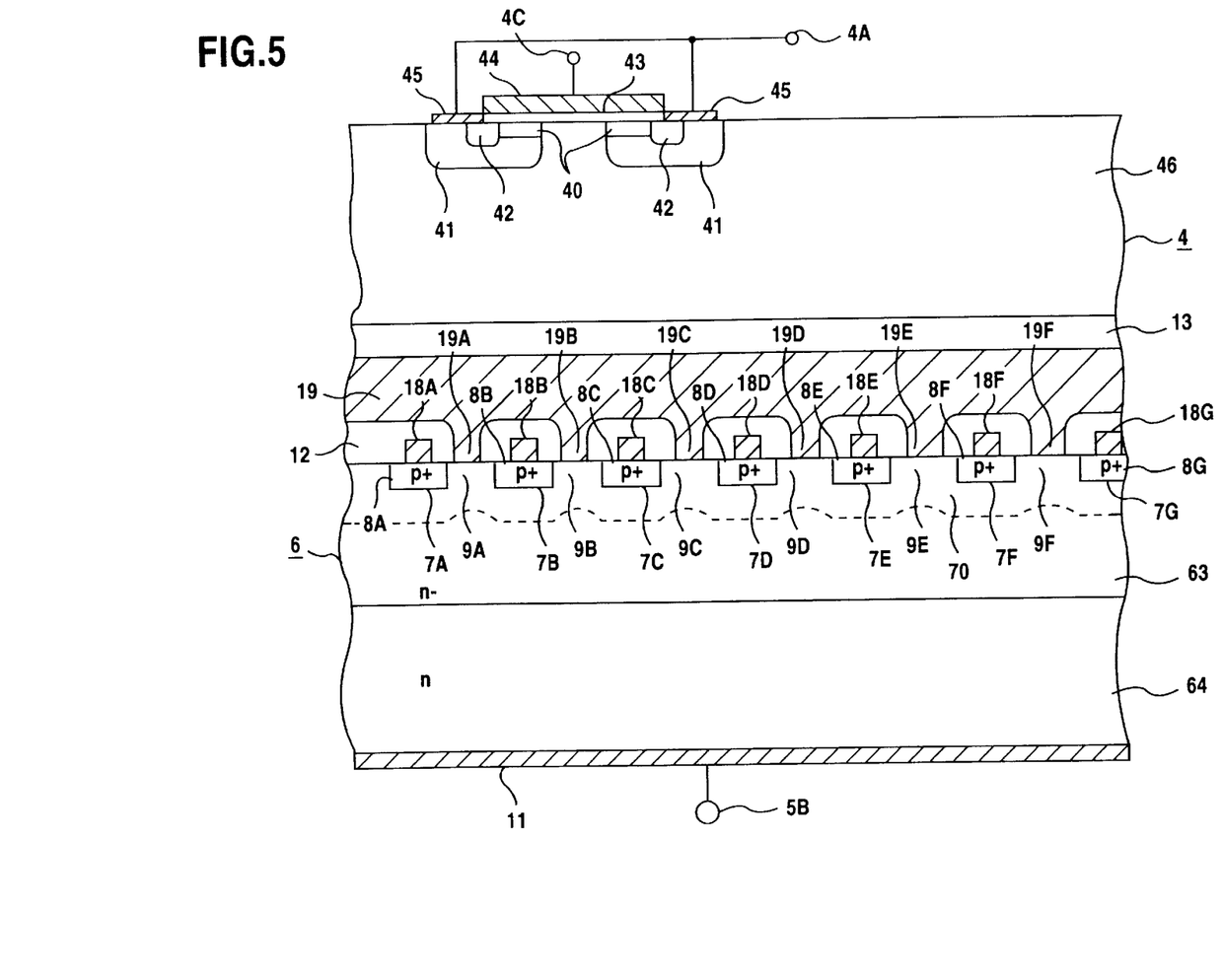
FIG. 5 is a partial sectional view of a further embodiment of the semiconductor configuration for the electronic device.

In the embodiment of the electronic device according to FIG. 5, a semiconductor configuration 5 constructed as in FIG. 2 and the silicon component 4 are integrated to form a hybrid component. An insulation layer 12 made of a dielectric material, for example silicon dioxide, is applied over the electrodes 18A to 18G assigned to the semiconductor regions 8A to 8G of the semiconductor configuration 5. The insulation layer 12 is provided with contact holes in regions above the channel regions 9A to 9F. An electrode layer 19 made of an electrically conductive material is applied to the insulation layer 12. Those parts of the electrode layer 19 which make contact with the channel regions 9A to 9F through the contact holes in the insulation layer 12 form the individual electrodes 19A to 19F. Such a structure can be produced using buried-gate technology. The silicon component 4 is bonded to the electrode layer 19 via a bonding layer 13. For the connection (bonding), it is possible to use, in particular, a soldering technique (chip-on-chip soldering), a bonding wire connection technique or else direct wafer bonding. The silicon component 4 that is provided is, for example, a vertical MOSFET using DDMOS technology which is known per se and therefore illustrated only diagrammatically, with a silicon wafer 46, a plurality of base regions 41 diffused into the silicon wafer 46, source regions 42 diffused into the base regions 41, at least one gate electrode 44, which is assigned via an insulator region 43 in each case to at least one channel 40 in the base region 41, and source electrodes 45, via which the source regions 42 and the base regions 41 are electrically short-circuited.

Figure 6:
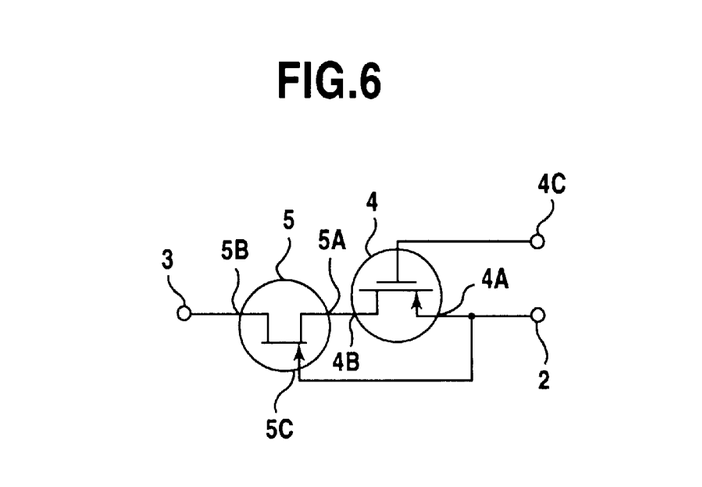
FIG. 6 is a circuit diagram of a circuit for an electronic device with a silicon MOSFET.

FIG. 6 illustrates a circuit diagram of an embodiment of the electronic device that can be constructed in a discrete embodiment. A silicon MOSFET, for example a commercially available low-voltage power MOSFET, is provided as the silicon component 4. The gate of the MOSFET forms the control terminal 4C, the source forms the first terminal 4A of the silicon component 4. The first terminal 4A is connected to the first terminal 2 of the electronic device. The drain forms the second terminal 4B of the silicon component 4. The semiconductor configuration 5 is represented by the circuit symbol of a JFET and can be designed as in FIG. 2, for example. The source of the JFET forms the first terminal 5A of the semiconductor configuration 5 and is thus short-circuited with the drain of the silicon MOSFET. The drain of the JFET forms the second terminal 5B of the semiconductor configuration 5 and is electrically connected to the second terminal 3 of the electronic device. The gate of the JFET forms the third terminal 5C of the semiconductor configuration 5 and is electrically short-circuited with the first terminal 2 of the electronic device and the source of the silicon MOSFET. Such an electronic device, which may be referred to as a hybrid power MOSFET, enables, in particular, reverse voltages of up to 5000 V and rated currents (forward currents) of between 5 A and 500 A to be achieved, if silicon carbide (SiC) is used as semiconductor material for the semiconductor configuration 5.

In yet a further embodiment of the novel electronic device it is possible to combine a semiconductor configuration 5 from the IGBT-like hybrid (cf. FIG. 4) based on silicon carbide (SiC) with a silicon MOSFET. In that case it is possible to achieve reverse voltages of up to 10,000 V and rated currents of between 100 A and 1000 A.

In general, the electronic device is connected as electronic switch into an electrical line or a line branch of an electrical voltage network, for the purpose of switching on and off an electric current for an electrical load.

If the silicon power MOSFET is replaced by a so-called smart power silicon MOSFET or a corresponding intelligent silicon component 4 for switching, then the electronic device can be equipped not only with switching functions but also with protection functions, such as e.g. overvoltage protection or overcurrent disconnection.

We claim:

1. An electronic device comprising:

two electrical terminals for connecting an electrical operating voltage with maximum values above 500 V;

a silicon component connected between said two electrical terminals and being selectively in one of an on state and an off state at an operating voltage of a predetermined polarity;

a semiconductor configuration made of silicon carbide with a first semiconductor region of a predetermined conductivity type and with at least one further semiconductor region of an opposite conductivity type, said first semiconductor region being more weakly doped than said at least one further semiconductor region at least in the channel region;

said semiconductor configuration and said silicon component together forming an integrated hybrid component;

a p-n junction formed between said first semiconductor region and said at least one further semiconductor region;

said first semiconductor region having at least one channel region adjacent said p-n junction and electrically connected in series with said silicon component between said two terminals;

said p-n junction being electrically connected between said two terminals in a reverse direction for the operating voltage of the predetermined polarity; and a depletion zone of said p-n junction pinching off or covering said at least one channel region of said first semiconductor region in the off state of said silicon component, said depletion zone expanding to a greater extent into said first semiconductor region.

2. The electronic device according to claim 1, wherein said first semiconductor region has a first surface and said at least one further semiconductor region is arranged on said first surface.

3. The electronic device according to claim 2, wherein said first semiconductor region has a second surface opposite said first surface of said first semiconductor region, and including an electrode disposed on said second surface.

4. The electronic device according to claim 2, wherein said first semiconductor region has a second surface opposite said first surface of said first semiconductor region, and said second surface includes a further semiconductor region of an opposite conductivity type disposed on said second surface, and an electrode disposed on a surface of said further semiconductor region remote from said first semiconductor region.

5. The electronic device according to claim 1, wherein said semiconductor configuration further comprises at least two further semiconductor regions of an opposite conductivity type to said first semiconductor region, and where each of said two further semiconductor regions forms a respective one of two p-n junctions with said first semiconductor region, and said at least one channel region is bounded by said two p-n junctions.

6. The electronic device according to claim 1, wherein said silicon component contains a MOS structure for switching between the on state and the off state.

7. The electronic device according to claim 6, wherein said silicon component is a silicon MOSFET.

8. The electronic device according to claim 1, wherein said two terminals are connected to carry electric currents through the device, and said device is provided for switching the electric currents.

* * * * *